US012730145B2

(12) United States Patent
Kim et al.

(10) Patent No.: US 12,730,145 B2
(45) Date of Patent: Sep. 8, 2026

(54) TEST CIRCUIT HAVING SEPARATELY ARRANGED DIGITAL AND ANALOG CIRCUITS FOR TESTING A DEVICE UNDER TEST

(71) Applicant: TECHWIDU CO., LTD., Suwon-si (KR)

(72) Inventors: Hyoung-Rae Kim, Hwaseong-si (KR); Dong-Yul Lee, Suwon-si (KR); Jun-Hyung Ha, Yongin-si (KR)

(73) Assignee: TECHWIDU CO., LTD., Suwon-si (KR)

( * ) Notice: Subject to any disclaimer, the term of this patent is extended or adjusted under 35 U.S.C. 154(b) by 190 days.

(21) Appl. No.: 18/683,270

(22) PCT Filed: Jul. 8, 2022

(86) PCT No.: PCT/KR2022/009982

§ 371 (c)(1),
(2) Date: Feb. 13, 2024

(87) PCT Pub. No.: WO2023/043020

PCT Pub. Date: Mar. 23, 2023

(65) Prior Publication Data

US 2024/0345159 A1 Oct. 17, 2024

(30) Foreign Application Priority Data

Sep. 14, 2021 (KR) ........................ 10-2021-0122259

(51) Int. Cl.
*G01R 31/3163* (2006.01)
*G01R 31/28* (2006.01)

(52) U.S. Cl.
CPC ..... *G01R 31/3163* (2013.01); *G01R 31/2831* (2013.01)

(58) Field of Classification Search
CPC .... G01R 1/073; G01R 31/28; G01R 31/2831; G01R 31/2889; G01R 31/3163;
(Continued)

(56) References Cited

U.S. PATENT DOCUMENTS 6,282,682 B1 * 8/2001 Walker ............ G01R 31/31924 714/738
7,893,701 B2 * 2/2011 Arkin ................ G01R 1/07307 324/754.07
(Continued)

FOREIGN PATENT DOCUMENTS

JP 3778050 B2 5/2006
JP 2010276374 A 12/2010
(Continued)

*Primary Examiner* — Vinh P Nguyen
(74) *Attorney, Agent, or Firm* — NKL Law; Jae Youn Kim

(57) ABSTRACT

Provided is a test circuit configured to receive an inspection command from automatic test equipment (ATE) and test a device under test (DUT), and the test circuit includes a plurality of analog inspection circuits electrically connected to the DUT to test an operation thereof, and a digital control circuit configured to control operations of the analog inspection circuits, wherein the digital control circuit and the analog inspection circuits are located apart from each other.

7 Claims, 4 Drawing Sheets

(58) Field of Classification Search
CPC .............. G01R 31/317; G01R 31/3181; G01R 31/318511; G01R 31/3025; G01R 1/07378; G01R 31/2834; G01R 1/0491; G01R 31/31905; G01R 31/2851; G01R 31/26; G01R 31/303; G01R 31/2818; G01R 31/309; G01R 31/31724; G01R 31/3177; G01R 31/31908; H04B 17/00; H04B 17/15; H04B 17/29
See application file for complete search history.

(56) References Cited

U.S. PATENT DOCUMENTS

| | | | | |
|---|---|---|---|---|
| 8,358,147 B2 * | 1/2013 | Pagani | G01R 31/3172 324/762.02 |
| 8,581,610 B2 * | 11/2013 | Miller | G01R 31/31905 324/754.01 |
| 9,372,227 B2 * | 6/2016 | Wang | G01R 31/2889 |
| 2011/0095778 A1 * | 4/2011 | Chou | G01R 31/3025 324/756.03 |
| 2016/0178667 A1 | 6/2016 | Spehlmann et al. | |

FOREIGN PATENT DOCUMENTS

| | | |
|---|---|---|
| KR | 100676185 B1 | 1/2007 |
| KR | 101028792 B1 | 4/2011 |

* cited by examiner

TEST CIRCUIT HAVING SEPARATELY ARRANGED DIGITAL AND ANALOG CIRCUITS FOR TESTING A DEVICE UNDER TEST

TECHNICAL FIELD

The present invention relates to a test circuit capable of efficiently utilizing a mounting area of a probe card by separately forming and arranging a digital control circuit and an analog test circuit.

DESCRIPTION OF THE RELATED ART

Fine patterns are formed on a semiconductor wafer and diced to form a semiconductor die, which is packaged to form a final product. As semiconductor devices formed on wafers become smaller, denser, and more highly integrated, defect determination for determining whether the semiconductor devices perform intended functions thereof in a wafer state has emerged as an important issue.

A probe card is a device that connects a semiconductor chip and test equipment to inspect an operation of a semiconductor device formed on a wafer. A probe pin electrically connected to the semiconductor device formed on the wafer is formed on the probe card. The probe pin is electrically connected to the semiconductor device to provide an electrical signal and detect a signal provided by the semiconductor device.

The probe card includes a power switch IC connected to a power element (power element DUT) of a device under test (DUT) and a plurality of signal switch ICs connected to a signal processing element (signal processing DUT) of the DUT.

Currently, semiconductor integration has reached a significantly high level, which requires a significantly large number of switch ICs to be mounted on a single probe card. However, since the area of the probe card is limited in the test environment, it is difficult to mount a plurality of switch ICs on the probe card, and the number of signal lines for control of the respective switch IC also increases as the number of switch ICs increases. Therefore, complexity of a probe card board has significantly increased.

This increase in complexity of the probe card leads to an increase in a design time of the probe card and an increase in manufacturing costs due to an increase in layers of the probe card. However, as semiconductor integration improves, complexity inevitably increases, making it difficult to solve the problem.

DETAILED DESCRIPTION OF THE INVENTION

Technical Problem

To perform testing of a semiconductor device, a probe card accurately comes into contact with an input/output pad of a wafer through a probe pin to conduct testing by providing a signal to a DUT and receive a signal from the DUT. However, an alignment process for accurate contact with the input/output pad through the probe pin takes a long time, which reduces semiconductor productivity.

Ideally, only one contact process needs to be performed to test a single wafer. However, as miniaturization progresses, the number of DUTs formed on the single wafer tends to increase. Therefore, to reduce an inspection time, the number of probe pins that need to be connected to the input/output pad on the wafer needs to increase, and the number of power switch ICs and signal switch ICs that need to be connected to the probe pins also needs to increase.

However, an increase in the number of power switch ICs and signal switch ICs mounted on the probe card causes difficulties in that the available mounting area or free mounting area decreases, and complexity of a board on which lines transmitting electrical signals are formed increases.

One problem to be solved by the present invention is to solve the difficulties of the conventional art.

Solution to the Technical Problem

In accordance with the present invention, the above and other objects can be accomplished by the provision of a test circuit configured to receive an inspection command from automatic test equipment (ATE) and test a device under test (DUT), the test circuit including a plurality of analog inspection circuits electrically connected to the DUT to test an operation thereof, and a digital control circuit configured to control operations of the analog inspection circuits, wherein the digital control circuit and the analog inspection circuits are located apart from each other.

According to an aspect of the present invention, the digital control circuit may include a decoder configured to decode a digital command provided by a controller, an inspection circuit selector configured to select one of the analog inspection circuits to perform inspection according to the decoded digital command, and a command encoder configured to encode an inspection circuit control command to control the analog inspection circuit to perform inspection.

According to an aspect of the present invention, the analog inspection circuits may each include a plurality of channels each connected to the DUT, a control command decoder configured to decode the encoded inspection circuit control command, and a channel controller configured to control the channels according to the decoded control command.

According to an aspect of the present invention, the digital control circuit may control at least some of the plurality of analog inspection circuits.

According to an aspect of the present invention, one or more of the analog inspection circuits may include one or more of a low dropout (LDO) regulator, a DC-DC converter, a power switch, an analog signal switch, or an analog-to-digital converter.

According to an aspect of the present invention, the analog inspection circuits may be located in an analog signal processing area, and the digital control circuit may be located in a digital signal processing area distinct from the analog signal processing area.

According to an aspect of the present invention, the analog inspection circuits and the digital control circuit may belong to a probe card formed on a substrate, the analog signal processing area may be formed on a first side of the substrate, and the digital signal processing area may be formed on a second side different from the first side of the substrate.

According to an aspect of the present invention, the substrate may be a multilayer board or a multi-wire board.

According to an aspect of the present invention, the analog signal processing area may be distributed and located within the probe card.

According to an aspect of the present invention, the analog signal processing area and the digital signal processing area may be located in different areas of the substrate on which the probe card is formed.

According to an aspect of the present invention, the digital control circuit may be capable of individually controlling a plurality of channels connected to each of the analog inspection circuits.

Advantageous Effect of the Invention

According to the present invention, there is an advantage in that the mounting area in the probe card may be efficiently utilized by separately forming and arranging the digital control circuits and the analog inspection circuits.

In addition, the conventional art requires signal lines, the number of which is the same as the number of channels, to control a plurality of channels connected to a plurality of DUTs. However, in this embodiment, since the digital control circuits control the plurality of analog inspection circuits using commands, there is an effect of being able to individually control a plurality of channels connected to each of the analog inspection circuits. Furthermore, there is an advantage of being able to facilitate design by reducing the number of control signals required for each channel for a plurality of channels connected to the analog inspection circuits.

The effects of the present invention are not limited to those mentioned above, and other problems not mentioned herein will be clearly understood by those skilled in the art from the above description.

BEST MODE IMPLEMENTING THE INVENTION

Figure 1:
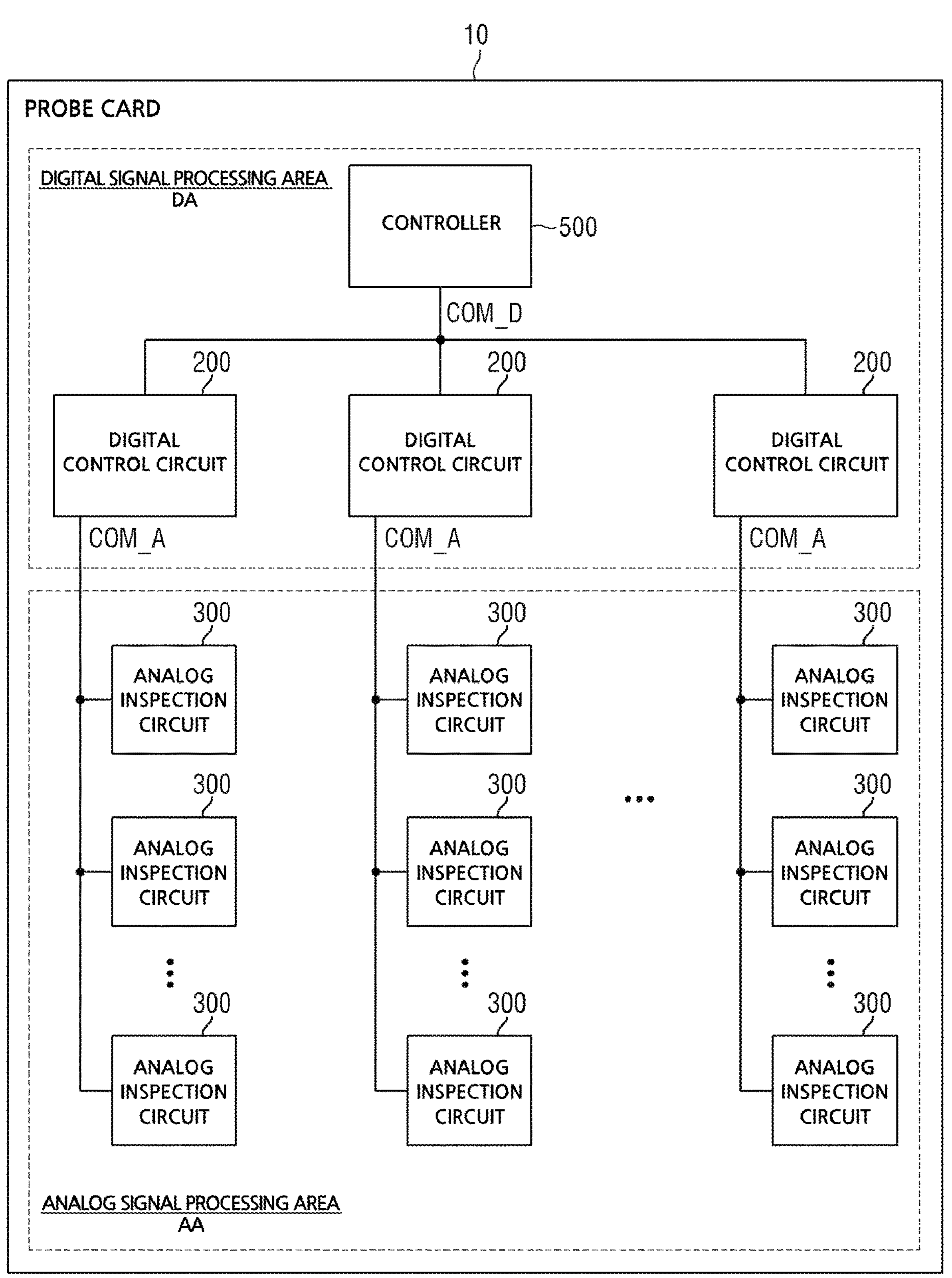
FIG. 1 is a block diagram schematically illustrating components of a probe card (10) and a connection relationship between the components.

A test circuit capable of efficiently utilizing a mounting area according to an embodiment of the present invention is a test circuit configured to receive an inspection command from an automatic test equipment (ATE) and test a DUT, the test circuit including a plurality of analog inspection circuits electrically connected to the DUT to test an operation thereof, and a digital control circuit configured to control operations of the analog inspection circuits, wherein the digital control circuit and the analog inspection circuits are located apart from each other.

Embodiment of the Invention for Implementation

Hereinafter, preferred embodiments of the present invention will be described in detail with reference to the attached drawings. Prior thereto, terms or words used in this specification and claims should not be construed as limited to usual or dictionary meanings, and should be interpreted as having meanings and concepts consistent with the technical idea of the present invention based on the principle that an inventor may appropriately define a concept of a term to describe the invention of the inventor in the best way possible. Therefore, the embodiments described in this specification and the configurations shown in the drawings are only one of the most preferred embodiments of the present invention and do not represent the entire technical idea of the present invention. Thus, it should be understood that, at the time of filing this application, there may be various equivalents and modifications that can replace the embodiments and configurations.

The terms used herein are used to describe specific embodiments and thus are not intended to limit the invention. As used herein, the singular forms include the plural forms unless the context clearly indicates otherwise.

Hereinafter, a probe card of the present invention will be described with reference to the attached drawings. For brief and clear description, the following illustrates an active-high signaling method activated in a logic-high state. However, this is for illustration, and it is obvious that an active-low signaling method activated in a logic-low state may be used for operation unlike the illustrated examples.

FIG. 1 is a block diagram schematically illustrating components of a probe card (10) and a connection relationship between the components. Referring to FIG. 1, the probe card (10) includes a plurality of analog inspection circuits (300) electrically connected to a DUT to test an operation thereof, a plurality of digital control circuits (200) configured to control operations of the analog inspection circuits (300), and a controller (500) configured to receive an inspection command (CMD) and provide a control command (COM_D) to control the digital control circuits (200) so that a corresponding DUT is inspected.

In one embodiment, the analog inspection circuits (300) are located in an analog signal processing area (AA), and the controller (500) and the digital control circuits (200) are located in a digital signal processing area (DA) distinct from the analog signal processing area (AA).

Figure 2:
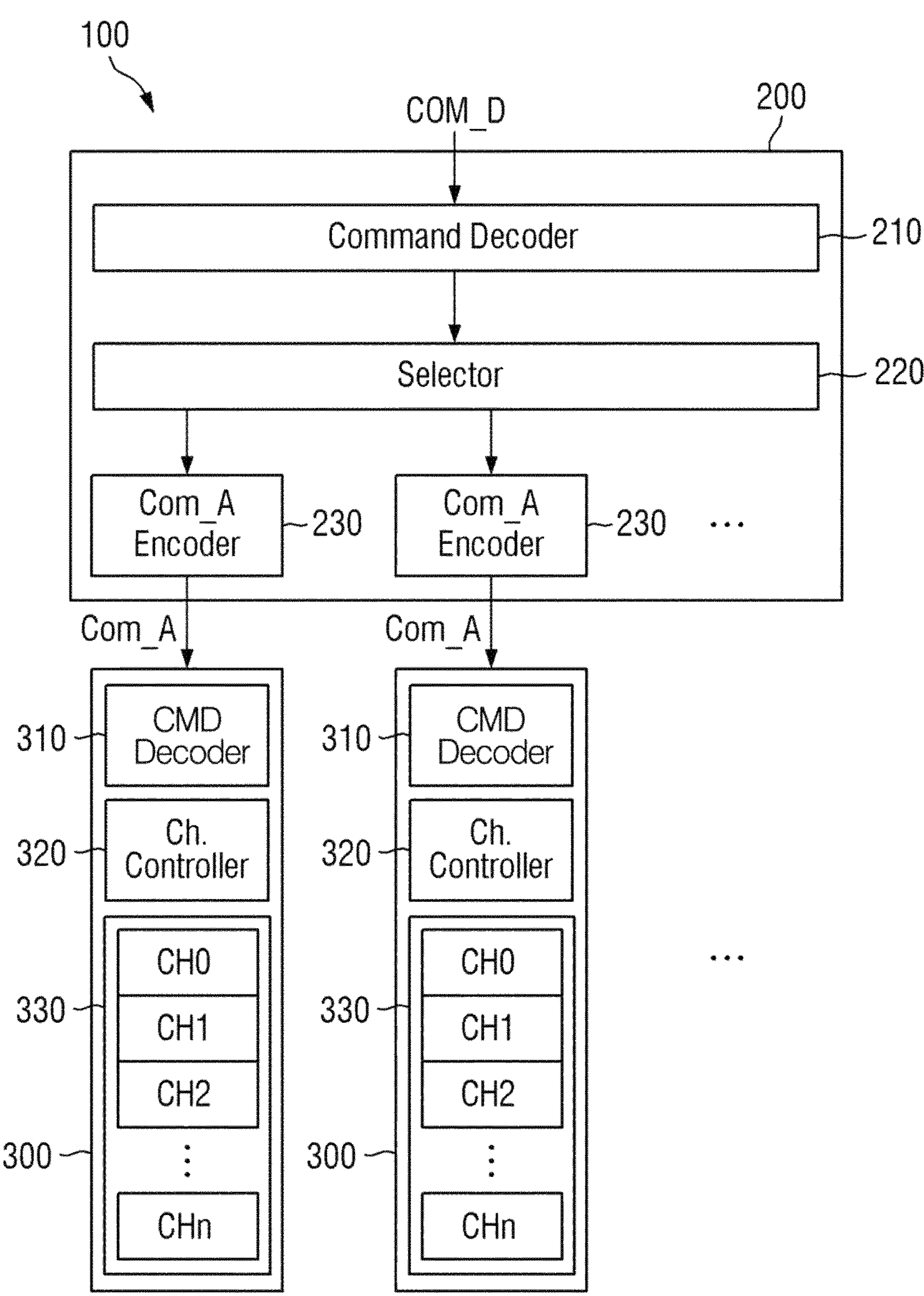
FIG. 2 is a block diagram schematically illustrating a test circuit (100) according to the present invention.
Figure 3:
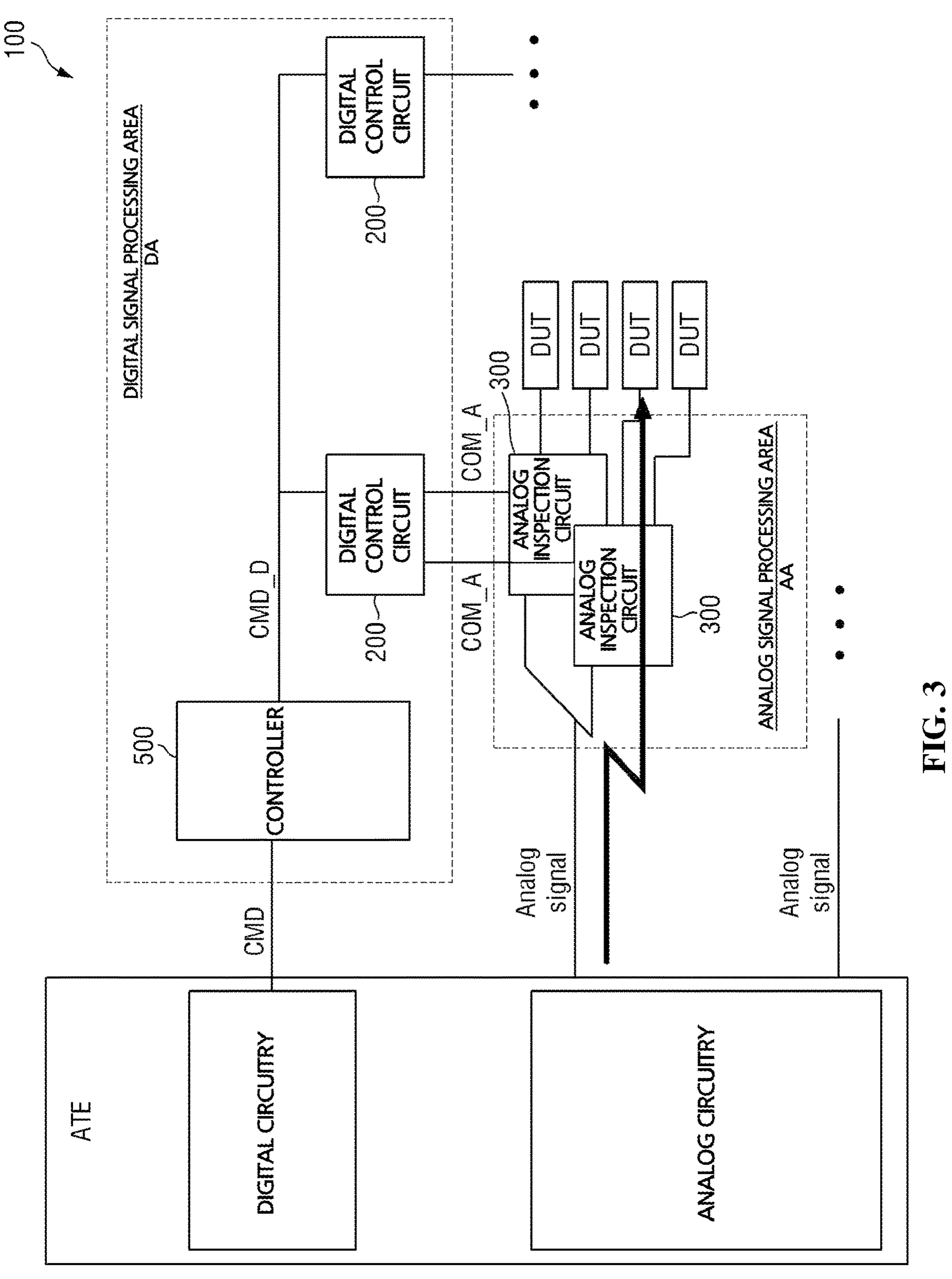
FIG. 3 is a schematic diagram for describing an operation of the test circuit (100) according to this embodiment.

FIG. 2 is a block diagram schematically illustrating a test circuit (100) according to the present invention, and FIG. 3 is a schematic diagram for describing an operation of the test circuit (100) according to this embodiment. Referring to FIGS. 1 to 3, the test circuit (100) is connected to ATE to operate. The ATE is a device electrically connected to the DUT to perform actual testing according to a test vector provided by a user and detect whether a defect is present by receiving a signal from the DUT. The ATE forms an inspection command (CMD) according to a unique signal protocol and provides the inspection command (CMD) to the controller (500).

The controller (500) receives a signal from the ATE and forms a digital control command (COM_D) corresponding to the signal provided by the ATE so that a target DUT may be inspected. Information about a mapping relationship between each of channels of the analog inspection circuits (300) and the DUT is not transmitted to the ATE. Therefore, the controller (500) converts the inspection command (CMD) provided by the ATE and forms the digital control command (COM_D) so that an appropriate DUT may be tested.

A command protocol of the ATE is generally different from a protocol used in the probe card (10). Therefore, the controller (500) interprets the inspection command (CMD) provided by the ATE according to the protocol of the ATE and forms the control command (COM_D) according to the command protocol used in the probe card (10) to output the control command (COM_D) to the digital control circuits (200). All of these processes are performed in the digital area.

The controller (500) receives the inspection command (CMD) provided by the ATE using a unique protocol, forms the control command (COM_D) corresponding thereto, and provides the control command (COM_D) to the digital control circuits (200) to control the digital control circuits (200). In one embodiment, the control command (COM_D) provided by the controller (500) may be provided to the digital control circuits (200) through 8-bit lines. As an example, the controller (500) may be implemented as a Field Programmable Gate Array (FPGA).

A decoder (210) receives the digital control command (COM_D) provided by the controller (500), decodes the command, and controls an inspection circuit selector (220) so that a target analog inspection circuit (300) is activated. The inspection circuit selector (220) provides a control command so that the corresponding analog inspection circuit and a target channel are activated, and a control command encoder (230) outputs an encoded inspection circuit control command (COM_A) to an analog inspection circuit (300) designated by the inspection circuit selector (220).

In one embodiment, the inspection circuit control command (COM_A) may be a signal for selection of an analog inspection circuit (300) to perform testing among the plurality of analog inspection circuits (300), channel activation, and/or control of the analog inspection circuit (300). As an example, the analog inspection circuit control command (COM_A) may be transmitted through a one-bit or two-bit transmission line connected between a digital control circuit (200) and an analog inspection circuit (300).

In one embodiment, the digital control circuit (200) is a circuit that performs digital operations, input and output of digital signals, and digital signal processing, and may include a microprocessor.

A control command decoder (310) of the analog inspection circuit (300) decodes the provided inspection circuit control command (COM_A) and outputs the command to a channel controller (320). The channel controller (320) activates a channel corresponding to the decoded inspection circuit control command so that inspection may be performed on the target DUT.

In one embodiment, the analog inspection circuit (300) includes an analog multiplexer. Accordingly, a single analog inspection circuit (300) is connected to a plurality of DUTs through a plurality of channels. An operation of each channel is controlled by the analog inspection circuit control command (COM_A). Therefore, the plurality of DUTs may be inspected through the one analog inspection circuit (300).

In addition, the analog inspection circuit (300) includes an analog circuit that performs inspection by providing an analog signal provided by the ATE to the DUT. In one embodiment, the analog circuit may include one or more of an LDO regulator, a DC-DC converter, and an analog-to-digital converter.

In one embodiment, an analog signal provided to the DUT through the analog inspection circuit (300) is used to measure characteristics of the DUT. For example, when measuring the amount of current consumed by the DUT, the ATE measures the magnitude of current provided as an analog signal.

As another example, when testing whether the DUT is correctly operating while finely adjusting a power voltage of the DUT, the ATE adjusts and provides a voltage of an analog signal line connected to a power supply of the ATE and detects an operation of the DUT.

As another example, when measuring leakage current at input/output of the DUT, the ATE measures a current leaking through an analog signal line connected to an input/output pin of the DUT.

Figure 4:
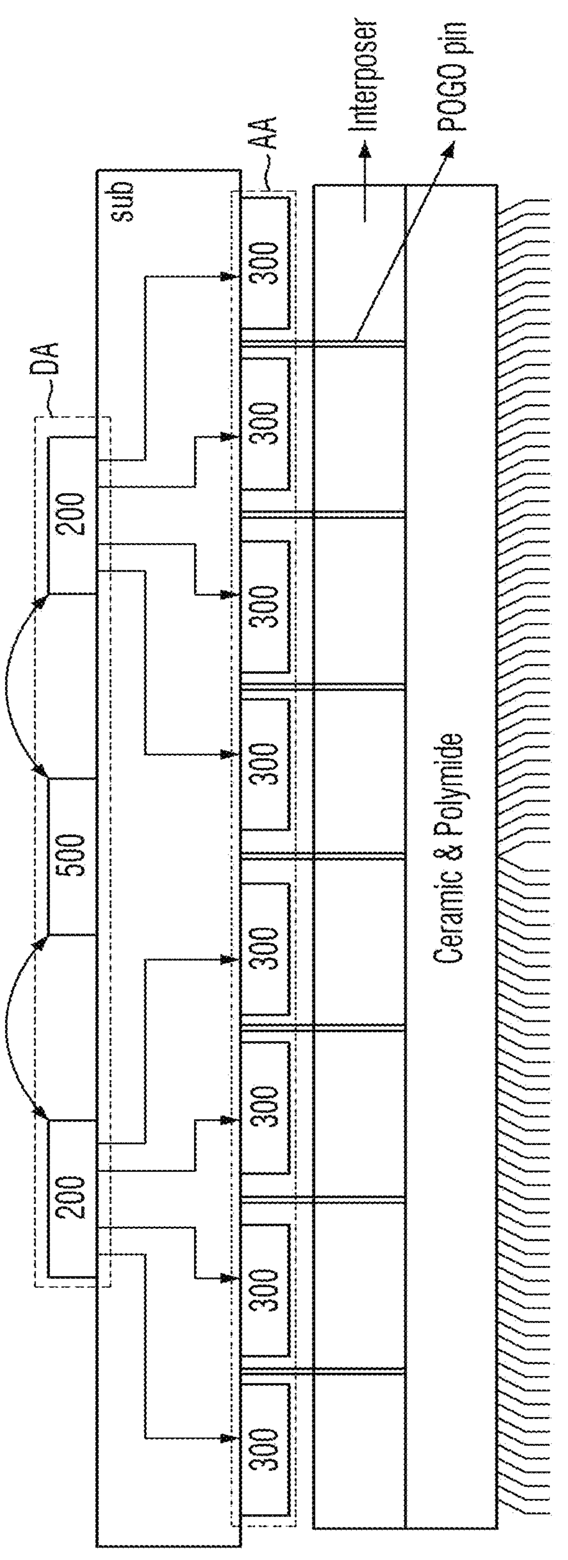
FIG. 4 is a diagram schematically illustrating a cross section of the probe card (10) according to this embodiment.

FIG. 4 is a diagram schematically illustrating a cross section of the probe card to which the test circuit (100) according to this embodiment belongs. Referring to FIG. 4, the analog inspection circuits (300), the digital control circuits (200), and the controller (500) may be located on a substrate (sub). In one embodiment, the substrate (sub) is a printed circuit board (PCB), and may be either a multilayer board or a multi-wire board in which conductive lines are formed in a plurality of layers.

The controller (500) and the digital control circuit (200) are connected by a conductive line, and may be connected by, for example, an 8-bit line. The digital control circuit (200) and the analog inspection circuit (300) are connected by a conductive line formed on the substrate (sub), and the digital control circuit (200) and the analog inspection circuit (300) may each be connected by a conductor of 1 to 2 bits.

The analog inspection circuits (300) are located in the analog signal processing area (AA) of the substrate (sub), and the controller (500) and the digital control circuits (200) are located in the digital signal processing area (DA) distinct from the analog signal processing area (AA) of the substrate (sub). In the embodiment illustrated in FIG. 4, the digital signal processing area (DA) where the controller (500) and the digital control circuits (200) are located is a first side of the substrate (sub), and the analog signal processing area (AA) where the analog inspection circuits (300) are located is a second side of the substrate (sub).

In the conventional art, when designing the substrate of the probe card (10), layout needs to be performed so that both an analog signal and a digital signal provided to the analog inspection circuits (300) are transmitted to the switch ICs connected to the DUT. As a result, in a process of forming wiring lines, there are problems in that complexity of the substrate increases, and the mounting area decreases due to an increase in the line area.

However, according to this embodiment, the control command (COM_D), which is a digital signal provided by the controller (500) to the digital control circuit (200), is sufficient to be laid out only up to the digital control circuit (200), so that consumption of the mounting area on the substrate may be minimized, and complexity of substrate design may be reduced.

Furthermore, the analog inspection circuit control command (COM_A) provided by the digital control circuit (200) to the analog inspection circuit (300) is only 1 to 2 bits, and the analog inspection circuit (300) mainly inputs and outputs analog signals, so that there is an advantage in that the signal line and the substrate are simplified.

In an embodiment not illustrated, the analog signal processing area (AA) where the analog inspection circuits (300) are located is the second side of the substrate (sub), and the analog inspection circuits (300) may be partially scattered and located on the probe card (10). Accordingly, a mounting space of the probe card (10) may be utilized at a high density, thereby improving mounting efficiency of the probe card, and preventing signal lines from being concentrated in a small area, which aids in simplifying the substrate.

Hereinafter, an operation of the test circuit (100) of this embodiment will be described with reference to FIGS. 1 to 4. Referring to FIGS. 1 to 4, the ATE specifies the DUT using the controller (500) and transmits an inspection command (CMD). As described above, the inspection command (CMD) may be a signal based on the ATE protocol.

The controller (500) decodes the inspection command (CMD) formed by the ATE protocol and checks a DUT to be tested. The controller (500) identifies a channel connected to the checked DUT and provides the digital control command (COM_D) to the digital control circuits (200) so that the corresponding channel is activated. The digital control circuits (200) receive the digital control command (COM_D) and control the analog inspection circuits (300) by providing an inspection circuit control command (COM_A) so that a channel corresponding to the control command (COM_D) is activated. When a channel between the analog inspection circuits (300) and the DUT is activated, analog circuitry of the ATE provides an analog signal including a test vector to the DUT, and the ATE evaluates an operation of the DUT from the analog signal.

The ATE is electrically connected to the DUT through the analog inspection circuits (300) included in the probe card (10). In this way, the ATE and DUT are connected each other to transmit and receive analog signals, and through this connection, analog characteristics such as operation evaluation and leakage current measurement may be evaluated.

According to the conventional art, a digital circuit and an analog circuit are integrated, a digital command needs to be provided for each piece of integrated circuitry, and the area required to form circuitry for processing thereof is not small, resulting in a significant loss in terms of area. However, as in this embodiment, a circuit for processing a digital command and a circuit for processing an analog signal are separated from each other, and the area for processing the digital command is formed as a separate circuit, so that waste of area and overhead may be reduced.

In addition, in the conventional art, when the probe card (10) is manufactured, both the analog signal and the digital signal need to be designed up to a location of an inspection circuit connected to the DUT. As a result, the area and design difficulty has increased.

However, according to this embodiment, it is sufficient to connect a plurality of digital signal lines for digital command transmission up to the digital control circuits (200), and the analog inspection circuits (300) mainly input and output only analog signals. Therefore, this provides an advantage of significantly reducing a length of a CMD-related signal, so that complexity of the probe card and line may be reduced.

In the conventional art, to control a plurality of channels connected to a plurality of DUTs, signal lines corresponding to the number of channels are required. However, in this embodiment, since the digital control circuits (200) control the analog inspection circuits (300) using commands, individual control of a plurality of channels connected to each of the analog inspection circuits (300) is possible. Furthermore, there is an advantage in that design may be facilitated by reducing the number of control signals required for each channel.

The terms used herein are used to describe specific embodiments and are not intended to limit the invention. As used herein, the singular forms may include the plural forms unless the context clearly indicates otherwise.

The invention claimed is:

1. A test circuit configured to receive an inspection command from automatic test equipment (ATE) through an electrical connection and test a device under test (DUT) based on the inspection command, the test circuit comprising:

a plurality of analog inspection circuits electrically connected to the DUT to test an operation thereof; and a digital control circuit configured to control operations of the analog inspection circuits, wherein the digital control circuit and the plurality of analog inspection circuits are located apart from each other, the test circuit further comprising a probe card, wherein the probe card includes a substrate on which the plurality of analog inspection circuits and the digital control circuit are disposed, the probe card including an analog signal processing area and a digital signal processing area, and the substrate including a first side and a second side, wherein the plurality of analog inspection circuits is located in the analog signal processing area, and the digital control circuit is located in the digital signal processing area, the digital signal processing area being distinct from the analog signal processing area, wherein the analog signal processing area is disposed on the first side, wherein the digital signal processing area is disposed on the second side, the second side being different from the first side, and wherein the digital control circuit comprises:

a decoder configured to decode a digital command provided by a controller, an inspection circuit selector configured to select one of the analog inspection circuits to perform inspection according to the decoded digital command, and a command encoder configured to encode and provide an inspection circuit control command to control the analog inspection circuit to perform inspection.

2. The test circuit according to claim 1, wherein each of the plurality of analog inspection circuits comprises:

a plurality of channels, each connected to the DUT, a control command decoder configured to decode the encoded inspection circuit control command, and a channel controller configured to control the channels according to the decoded control command.

3. The test circuit according to claim 1, wherein the digital control circuit controls one or more of the plurality of analog inspection circuits.

4. The test circuit according to claim 1, wherein the substrate is a multilayer board or a multi-wire board.

5. The test circuit according to claim 1, wherein the analog signal processing area is located within the first side of the substrate of the probe card.

6. The test circuit according to claim 1, wherein the analog signal processing area and the digital signal processing area are located in different areas of the substrate.

7. The test circuit according to claim 1, wherein each of the plurality of analog circuits includes a plurality of channels, each of the plurality of channels being connected to the DUT, and the digital control circuit is configured to individually control the plurality of channels.

* * * * *